(12) United States Patent
Wang et al.

(10) Patent No.: US 10,386,574 B2
(45) Date of Patent: Aug. 20, 2019

(54) INTEGRATED PHOTONIC DEVICE COMPRISING HOLLOWED SILICON SUBSTRATE-BASED LED AND OPTICAL WAVEGUIDE AND MANUFACTURING METHOD THEREOF

(71) Applicant: NANJING UNIVERSITY OF POSTS AND TELECOMMUNICATIONS, Nanjing (CN)

(72) Inventors: Yongjin Wang, Nanjing (CN); Guixia Zhu, Nanjing (CN); Dan Bai, Nanjing (CN); Jialei Yuan, Nanjing (CN); Yin Xu, Nanjing (CN); Hongbo Zhu, Nanjing (CN)

(73) Assignee: NANJING UNIVERSITY OF POSTS AND TELECOMMUNICATIONS, Nanjing (CN)

( * ) Notice: Subject to any disclaimer, the term of this patent is extended or adjusted under 35 U.S.C. 154(b) by 0 days.

(21) Appl. No.: 15/973,285

(22) Filed: May 7, 2018

(65) Prior Publication Data
US 2018/0267238 A1 Sep. 20, 2018

Related U.S. Application Data

(63) Continuation of application No. PCT/CN2016/080090, filed on Apr. 23, 2016.

(30) Foreign Application Priority Data

Nov. 6, 2015 (CN) .......................... 2015 1 0752581

(51) Int. Cl.
*G02B 6/12* (2006.01)
*G02B 6/13* (2006.01)
(Continued)

(52) U.S. Cl.
CPC ......... *G02B 6/1225* (2013.01); *G02B 6/1223* (2013.01); *G02B 6/131* (2013.01);
(Continued)

(58) Field of Classification Search
CPC ...... G02B 6/1223; G02B 6/1225; G02B 6/13; G02B 6/131; G02B 6/132; G02B 6/136;
(Continued)

(56) References Cited

U.S. PATENT DOCUMENTS 4,706,103 A 11/1987 Ranganath
5,125,065 A 6/1992 Stoll
(Continued)

FOREIGN PATENT DOCUMENTS

CN 1371483 9/2002
CN 1481032 A 3/2004
(Continued)

OTHER PUBLICATIONS

"Characteristics of GaN-based LED fabricated on a GaN-on-silicon platform" by Shi et al, Applied Physics Express, vol. 7, 082102, Jul. 14, 2014.*
(Continued)

*Primary Examiner* — Robert Tavlykaev
(74) *Attorney, Agent, or Firm* — Arch & Lake LLP

(57) ABSTRACT

By using various anisotropic silicon etching techniques, a silicon substrate layer (1) and an epitaxial buffer layer (2) under the device structure are removed to obtain a monolithic photonic integration of silicon substrate suspended light-emitting diode (LED) with optical waveguide, and an ultra-thin device monolithically integrated with a suspended LED and an optical waveguide is obtained by further using the nitride back thinning etching technique. Therefore, internal loss of the LED is reduced and light emitting efficiency is improved. In the device according to the present disclo-
(Continued)

sure, the light source and the optical waveguide are integrated on the same wafer, which solves the problem of monolithic integration of planar photons, enables the light emitted by the LED to be transmitted along the optical waveguide, addresses the problem of transmission of light in the optical waveguide, and implements the function of transmitting light within a plane.

7 Claims, 3 Drawing Sheets

(51) Int. Cl.

| | | |
|---|---|---|
| G02B 6/122 | (2006.01) | |
| G02B 6/136 | (2006.01) | |
| G02B 6/132 | (2006.01) | |
| G02F 1/025 | (2006.01) | |
| H01L 33/20 | (2010.01) | |
| H01L 33/00 | (2010.01) | |
| H01L 33/38 | (2010.01) | |

(52) U.S. Cl.
CPC ............ *G02B 6/132* (2013.01); *G02B 6/136* (2013.01); *G02F 1/025* (2013.01); *H01L 33/007* (2013.01); *H01L 33/20* (2013.01); *G02B 2006/12061* (2013.01); *H01L 33/385* (2013.01)

(58) Field of Classification Search
CPC .......... G02B 2006/12128; H01L 33/20; H01L 33/0062; H01L 33/0066; H01L 33/007; H01L 33/0075; H01L 33/0079
USPC .................. 385/130; 257/E33.025, E31.041
See application file for complete search history.

(56) References Cited

U.S. PATENT DOCUMENTS

| | | | | |
|---|---|---|---|---|
| 6,263,140 B1* | 7/2001 | Stegmuller | ........ | G02B 6/12004 385/129 |
| 6,355,945 B1* | 3/2002 | Kadota | ............... | H01L 27/1443 257/190 |
| 6,873,638 B2* | 3/2005 | Haase | ........................ | H01S 5/10 372/102 |
| 7,947,576 B2* | 5/2011 | Igari | .................... | H01L 33/0095 257/190 |
| 8,993,409 B2* | 3/2015 | Lu | ........................... | H01L 33/20 257/76 |
| 2003/0116791 A1* | 6/2003 | Baptist | .................... | H01J 31/00 257/214 |
| 2009/0114900 A1* | 5/2009 | Udagawa | ............... | B82Y 20/00 257/13 |
| 2011/0037098 A1* | 2/2011 | Kim | .................... | H01L 21/0237 257/190 |
| 2016/0327737 A1* | 11/2016 | Zhang | ................. | H01L 27/0688 |

FOREIGN PATENT DOCUMENTS

| | | |
|---|---|---|
| CN | 102530820 | 7/2012 |
| CN | 103066148 | 4/2013 |
| CN | 103633203 A | 3/2014 |
| CN | 103779452 | 5/2014 |
| CN | 103779452 A | 5/2014 |
| CN | 104170089 A | 11/2014 |
| CN | 105445854 A | 3/2016 |
| JP | 2006227655 | 8/2006 |
| WO | 2010040566 | 4/2010 |
| WO | 2015108488 | 7/2015 |
| WO | 2015108488 A1 | 7/2015 |

OTHER PUBLICATIONS

"Near-field optical study of AlGaN/GaN quantum-well waveguide" by Shakya et al, Applied Physics Letters, vol. 84, pp. 1832-1834 , 2004.*

"Experimental observation of lateral emission in freestanding GaN-based membrane devices" by Shi et al, Optics Letters, vol. 39, No. 16, pp. 4931-4933, 2014.*

"A wavelength-selective photonic-crystal waveguide coupled to a nanowire light source" by Park et al, Nature Photonics, vol. 2, pp. 622-626, 2008.*

Dan Bai, Xumin Gao, Yin Xu, Yongjin Wang, "Visible light propagation inside free-standing InGaN/GaN quantum-well rib waveguides", (international conference on optical communications and network) Optical Communications and Networks (ICOCN), 2015 14th International Conference on Jul. 3-5, 2015, Nanjing, China (Abstract Only), https://ieeexplore.ieee.org/document/7203773/.

* cited by examiner

INTEGRATED PHOTONIC DEVICE COMPRISING HOLLOWED SILICON SUBSTRATE-BASED LED AND OPTICAL WAVEGUIDE AND MANUFACTURING METHOD THEREOF

CROSS-REFERENCE TO RELATED APPLICATIONS

This application is a continuation of International Application No. PCT/CN2016/080090, filed on Apr. 23, 2016, which is based upon and claims priority to Chinese Patent Application No. 201510752581.9, filed on Nov. 6, 2015, the entire contents of which are incorporated herein by reference.

TECHNICAL FIELD

The present disclosure relates to the technical field of information materials and devices, and in particular, relates to a monolithic photonic integration of silicon substrate suspended light-emitting diode (LED) with optical waveguide, and a fabrication method thereof.

BACKGROUND

From the perspective of materials, nitride materials, especially GaN materials, have a high refractive index (about 2.5), are transparent in visible light and near-infrared wavelength bands and thus are excellent optical materials. However, since SiC and sapphire substrates are difficult to manufacture and the manufacture technique of nitride, especially GaN, is not matured, developments nitride photons and optical microelectromechanical devices are greatly hindered. In recent years, lattice mismatch and remaining stress caused by inconsistent thermal expansion are compensated by introducing AlN/AlGaN or other unique buffer layers, and high-quality nitride materials based on silicon substrates are gradually being matured are being available in the market. A few companies have developed nitride materials based on silicon substrate. Many high-tech material enterprises incubated by academic research institutes are transforming their internal material growing technologies to more other enterprises, and may provide 4-inch or even large-size nitride materials based on silicon substrate according to the needs of users. In addition, the manufacture technique of the nitride materials is constantly being innovated and developed. This material system may be combined with the current matured silicon manufacture technique to fabricate novel nitride optical devices in large scale and with low cost. With respect to the nitride material based on silicon substrate, by using the matured silicon etching technique, the silicon substrate may be removed such that a suspended nitride thin film device is fabricated. This provides a foundation for the development of the nitride photons and optical microelectromechanical devices oriented to optical communication and optical sensing.

SUMMARY

Technical Problem

The present disclosure provides a monolithic photonic integration of silicon substrate suspended light-emitting diode (LED) with optical waveguide. The device has an ultra-thin nitride thin film, implements monolithic integration of planar photons and transmission of lights in a planar optical waveguide, and improves light source utilization rate inside the LED. In addition, the present disclosure further provides a method for fabricating the device.

Technical Solution

The present disclosure provides a monolithic photonic integration of silicon substrate suspended light-emitting diode (LED) with optical waveguide, where the photonic device is carried on a silicon-based nitride wafer, and comprises a silicon substrate layer, an epitaxial buffer layer arranged on the silicon substrate layer and a P-N junction arranged on the epitaxial buffer layer. The P-N junction comprises an n-GaN layer, an InGaN/GaN quantum well and a p-GaN layer that are sequentially connected from bottom to top. A p-electrode is arranged on the p-GaN layer, a step-shaped stage is etched on an upper surface of the n-GaN layer, the step-shaped stage comprises an upper stage and a lower stage arranged on a side of the upper stage. The upper stage is connected to a bottom face of the InGaN/GaN quantum well. An n-electrode is arranged on the lower stage. The n-GaN layer, the InGaN/GaN quantum well, the p-GaN layer, the p-electrode and the n-electrode form an LED. An optical waveguide is integrated on the LED. A cavity opposite to the p-electrode, the n-electrode and the optical waveguide and passing through the silicon substrate layer and the epitaxial buffer layer is arranged under the n-GaN layer, such that the LED and the optical waveguide are suspended.

Further, in the monolithic photonic integration of silicon substrate suspended LED with optical waveguide according to the present disclosure, the p-electrode is formed by a p-electrode light-emitting region, a p-electrode conductive region and a p-electrode wiring region that are sequentially connected; the n-electrode is formed by an n-electrode conductive region and an n-electrode wiring region that are connected to each other; and the cavity is arranged under the p-electrode light-emitting region, the p-electrode conductive region, the n-electrode conductive region and the optical waveguide.

Further, in the monolithic photonic integration of silicon substrate suspended LED with optical waveguide according to the present disclosure, the LED and the optical waveguide are both practiced on a nitride layer of the silicon-based nitride wafer, and the optical waveguide is connected to the n-GaN layer, the InGaN/GaN quantum well and the p-GaN layer.

Further, in the monolithic photonic integration of silicon substrate suspended LED with optical waveguide according to the present disclosure, a plurality of optical waveguides are integrated on the LED.

Further, in the monolithic photonic integration of silicon substrate suspended LED with optical waveguide according to the present disclosure, the p-electrode and the n-electrode of the LED are both Ni/Au electrodes in which a deposited metal material is Ni/Au.

The method for fabricating the monolithic photonic integration of silicon substrate suspended LED with optical waveguide according to the present disclosure comprises the following steps:

step (1): polishing to thin the silicon substrate of nitride-on-silicon wafer from backside;

step (2): coating a photoresist layer on the top surface of nitride-on-silicon wafer, and defining an optical waveguide region and an n-GaN step region on the photoresist layer by photolithography;

step (3): etching the n-GaN step region and the optical waveguide region by using a reactive ion beam;

step (4): removing residual photoresist to obtain the step-shaped stage, the p-GaN layer (5), the InGaN/GaN quantum well and the optical waveguide;

step (5): uniformly coating a photoresist layer on the upper surface of the silicon-based nitride wafer, lithographically defining a p-electrode window region and an n-electrode window region, vapor depositing Ni/Au in the p-electrode window region and the n-electrode window region respectively to form ohmic contact and practice the p-electrode and the n-electrode, wherein after the residual photoresist is removed, an LED is obtained;

step (6): fully covering a thick photoresist on the top device structures for device protection, and spin coating a photoresist layer on the bottom silicon substrate, and photolithographically defining a backside etching window aligning with and totally covering the conductive region and the light-emitting region in a p-electrode region, and the conductive region and the optical waveguide region in an n-electrode region by the double-sided alignment technique;

step (7): using the epitaxial buffer layer as an etching barrier layer, and etching the silicon-based substrate layer to a lower surface of the epitaxial buffer layer to form a cavity via a back etching window by using the back deep silicon etching technique;

step (8): thinning the nitride on the epitaxial buffer layer and the n-GaN layer from bottom to top by using the nitride back thinning etching technique; and step (9): removing residual photoresist to obtain the photonic wavelength integrated photonic device of a silicon substrate suspended LED.

Further, in the fabrication method, in step (5), vapor deposition of Ni/Au is practiced by lift-off process and nitrogen annealing technique under a temperature of 500±5° C.

Further, in the fabrication method, in step (8), the back thinning etching technique is ion beam bombardment or reactive ion beam etching technique.

According to the present disclosure, by using the exposure technique and nitride etching process, the LED and the optical waveguide are transferred to the nitride device layer at the top layer. By using various anisotropic silicon etching techniques, the silicon substrate layer and the epitaxial buffer layer under the device structure are removed, an ultra-thin device monolithically integrated with a suspended LED and an optical waveguide is obtained by further using the nitride back thinning etching technique.

Beneficial effects: compared with the related art, the present disclosure has the following advantages:

In the monolithic photonic integration of silicon substrate suspended LED with optical waveguide according to the present disclosure, as compared with integration of an LED and an optical waveguide that are made from different materials and isolated, the optical waveguide and the LED both employ the same nitride substance such that they are integrated on the same wafer. This simplifies the fabrication process, reduces the complexity, and solves the problem of monolithic integration of planar photons.

In the photonic device according to the present disclosure, the LED and the optical waveguide are integrated on the same wafer, such that the light emitted by the LED is transmitted along the optical waveguide, thereby improving light source utilization rate inside the LED, and implements the function of transmitting light within a planar optical waveguide.

In the monolithic photonic integration of silicon substrate suspended LED with optical waveguide according to the present disclosure, the fabrication technique may be compatible with the silicon manufacturing technique. In this way, a planar photon integrated device oriented to optical communication and optical sensing in the visible light wavelength band may be achieved.

With the method for fabricating the monolithic photonic integration of silicon substrate suspended LED with optical waveguide according to the present disclosure, by using the exposure technique and nitride etching process, the LED and the optical waveguide are transferred to the nitride device layer at the top layer; and using various anisotropic silicon etching techniques, the silicon substrate layer under the device structure is removed to obtain a photonic device integrated with a suspended LED and an optical waveguide. This implements monolithic integration of planar photons, reduces internal loss of the LED, and improves light emitting efficiency.

Reference signs and denotations thereof: 1—silicon substrate layer, 2—epitaxial buffer layer, 3—n-GaN, 4—InGaN/GaN quantum well, 5—p-GaN layer, 6—p-electrode, 7—n-electrode, 8—optical waveguide, 9—p-electrode light-emitting region, 10—p-electrode conductive region, 11—p-electrode wiring region, 12—n-electrode conductive region, and 13—n-electrode wiring region.

DETAILED DESCRIPTION

The present disclosure is further described with reference to the accompanying drawings and exemplary embodiments.

The terminology used in the present disclosure is for the purpose of describing exemplary embodiments only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may include used herein to describe various information, the information should not be limited by these terms. These terms are only used to distinguish one category of information from another. For example, without departing from the scope of the present disclosure, first information may include termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an embodiment is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may include combined in any suitable manner.

Figure 1:
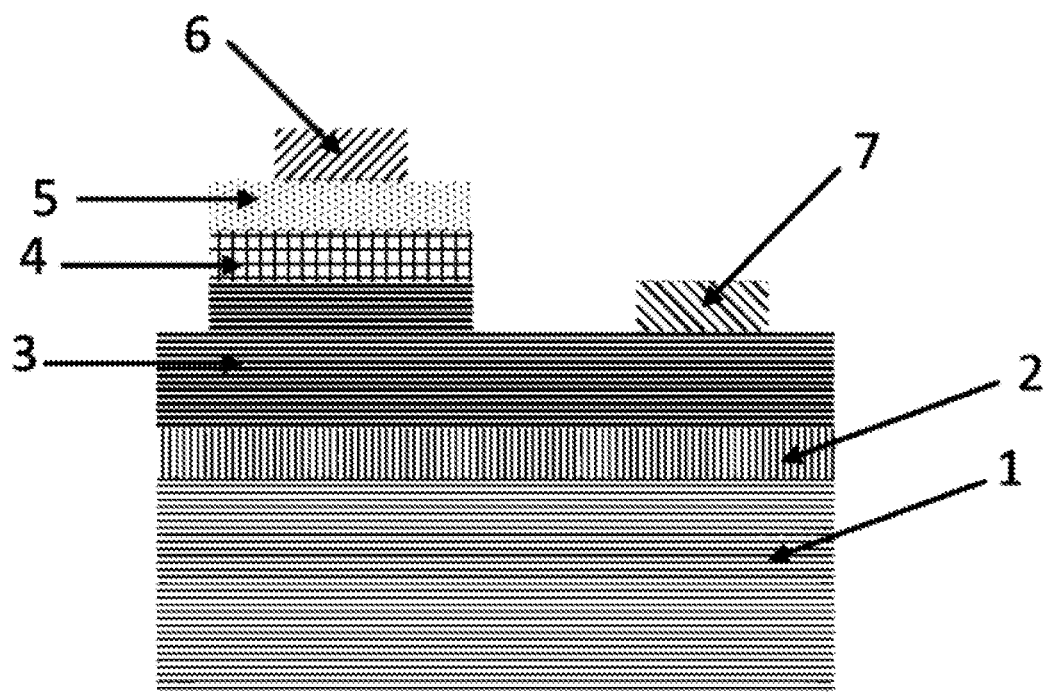
FIG. 1 is a schematic structural view of a monolithic photonic integration of silicon substrate suspended light-emitting diode (LED) with optical waveguide according to the present disclosure.
Figure 2:
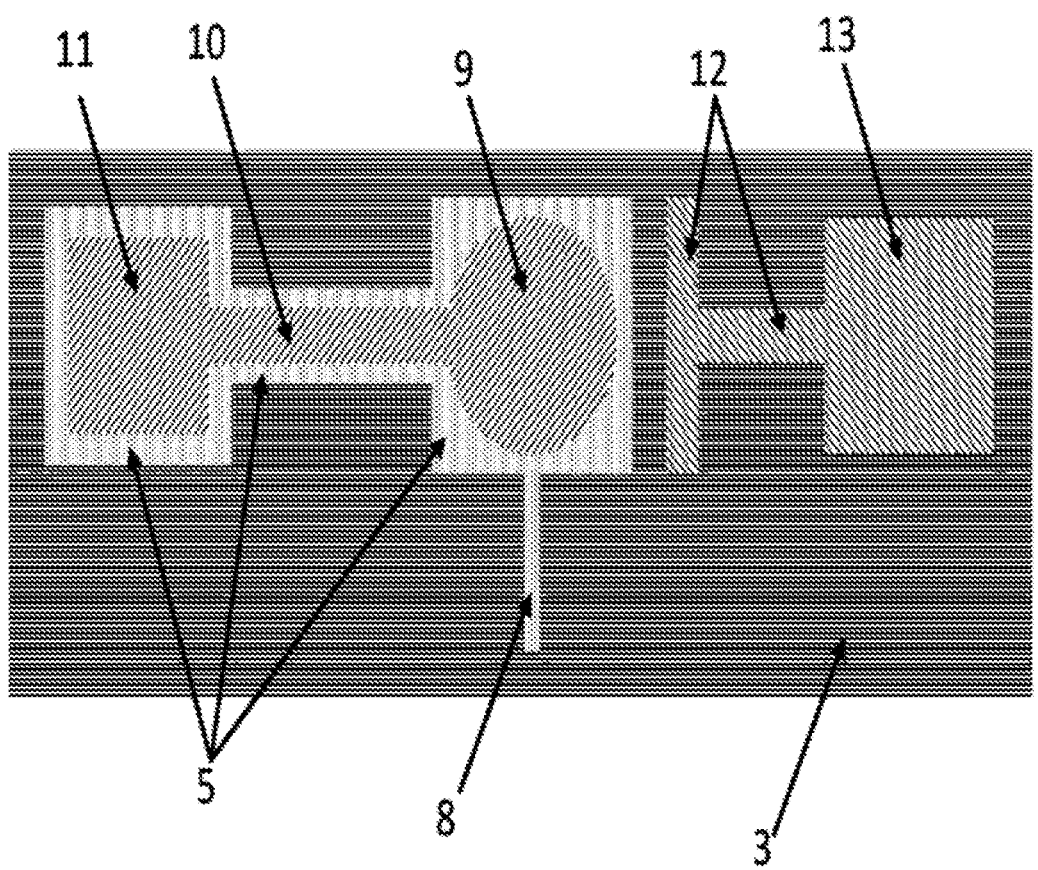
FIG. 2 is a front top view of the monolithic photonic integration of silicon substrate suspended LED with optical waveguide according to the present disclosure.

FIG. 1 and FIG. 2 are schematic structural views of a monolithic photonic integration of silicon substrate suspended light-emitting diode (LED) with optical waveguide according to the present disclosure. FIG. 1 is a schematic structural view of a monolithic photonic integration of silicon substrate suspended light-emitting diode (LED) with optical waveguide according to an aspect of the present disclosure. The photonic device is carried on a silicon-based nitride wafer, and comprises a silicon substrate layer 1, an epitaxial buffer layer 2 arranged on the silicon substrate layer and a P-N junction arranged on the epitaxial buffer layer; wherein the P-N junction comprises an n-GaN layer 3, an InGaN/GaN quantum well 4 and a p-GaN layer 5 that are sequentially connected from bottom to top, wherein a p-electrode 6 is arranged on the p-GaN layer 5, a step-shaped stage is etched on an upper surface of the n-GaN layer 3, the step-shaped stage comprises an upper stage and a lower stage arranged on a side of the upper stage, the upper stage is connected to a bottom face of the InGaN/GaN quantum well 4, an n-electrode 7 is arranged on the lower stage, the n-GaN layer 3, the InGaN/GaN quantum well 4, the p-GaN layer 5, the p-electrode 6 and the n-electrode 7 form an LED.

FIG. 2 is a front top view of the monolithic photonic integration of silicon substrate suspended LED with optical waveguide according to an aspect of the present disclosure. In FIG. 2, an optical waveguide 8 is integrated on the LED, and a cavity opposite to the p-electrode 6, the p-electrode 7 and the optical waveguide 8 and passing through the silicon substrate layer 1 and the epitaxial buffer layer 2 is arranged under the n-GaN layer 3, such that the LED and the optical waveguide are suspended. The p-electrode 6 is formed by a p-electrode light-emitting region 9, a p-electrode conductive region 10 and a p-electrode wiring region 11 that are sequentially connected; the n-electrode 7 is formed by an n-electrode conductive region 12 and an n-electrode wiring region 13 that are connected to each other; and the cavity is arranged under the p-electrode light-emitting region 9, the p-electrode conductive region 10, the n-electrode conductive region 12 and the optical waveguide 8.

In the monolithic photonic integration of silicon substrate suspended LED with optical waveguide, an optical waveguide and a photodetector according to the present disclosure, in the InGaN/GaN quantum well 4, InGaN and GaN are spacedly deposited to form a quantum layer.

Further, in the monolithic photonic integration of silicon substrate suspended LED with optical waveguide 8 according to the present disclosure, the LED and the optical waveguide 8 are both practiced on a nitride layer of the silicon-based nitride wafer, and the optical waveguide is connected to the n-GaN layer 3, the InGaN/GaN quantum well 4 and the p-GaN layer 5.

In an exemplary embodiment of the monolithic photonic integration of silicon substrate suspended LED with optical waveguide according to the present disclosure, a plurality of optical waveguides 8 are integrated on the LED.

In another exemplary embodiment of the present disclosure, the p-electrode and the n-electrode of the LED are both Ni/Au electrodes in which a deposited metal material is Ni/Au.

Figure 3:
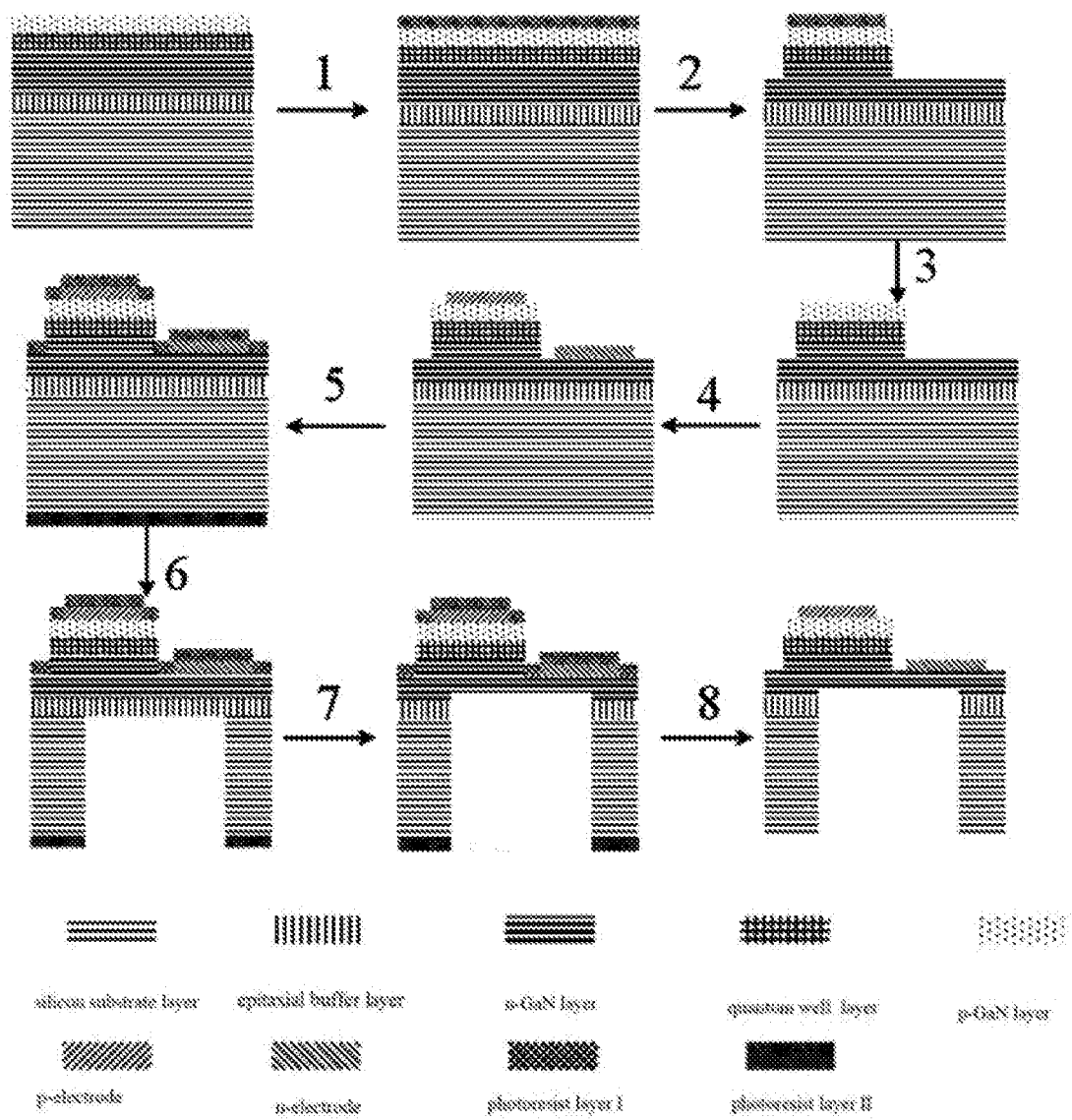
FIG. 3 is a flowchart of fabricating the monolithic photonic integration of silicon substrate suspended LED with optical waveguide according to the present disclosure.

FIG. 3 is a flowchart of fabricating the monolithic photonic integration of silicon substrate suspended LED with optical waveguide according to the present disclosure. A method for fabricating the monolithic photonic integration of silicon substrate suspended LED with optical waveguide according to the present disclosure specifically comprises the following steps:

1) polishing to thin the silicon substrate 1 of nitride-on-silicon wafer from backside;
2) coating a photoresist layer on the top surface of nitride-on-silicon wafer, and defining an optical waveguide region and an n-GaN step region on the photoresist layer by photolithography;
3) etching the n-GaN step region and the optical waveguide region by using a reactive ion beam;
4) removing residual photoresist to obtain the step-shaped stage, the p-GaN layer 5, the InGaN/GaN quantum well 4 and the optical waveguide 8;
5) uniformly coating a photoresist layer on the upper surface of the silicon-based nitride wafer, lithographically defining a p-electrode window region and an n-electrode window region, vapor depositing Ni/Au in the p-electrode window region and the n-electrode window region respectively to form ohmic contact and practice the p-electrode 6 and the n-electrode 7, wherein after the residual photoresist is removed, an LED is obtained;
6) fully covering a thick photoresist on the top device structures for device protection, and spin coating a photoresist layer on the bottom silicon substrate 1, and photolithographically defining a backside etching window aligning with and totally covering the conductive region and the light-emitting region in a p-electrode region, and the conductive region and the optical waveguide region in an n-electrode region by the double-sided alignment technique;
7) using the epitaxial buffer layer 2 as an etching barrier layer, and etching the silicon-based substrate layer 1 to a lower surface of the epitaxial buffer layer 2 to form a cavity via a back etching window by using the back deep silicon etching technique;
8) thinning the nitride on the epitaxial buffer layer 2 and the n-GaN layer 3 from bottom to top by using the nitride back thinning etching technique; and
9) removing residual photoresist to obtain the photonic wavelength integrated photonic device of a silicon substrate suspended LED.

Described above are merely exemplary embodiments of the present disclosure. It should be noted that persons of ordinary skill in the art would make various improvements and equivalent replacements to these embodiments without departing from the principle of the present disclosure. Technical solutions defined by these improvements and equivalent replacements shall all fall within the protection scope of the present disclosure.

What is claimed is:
1. An integrated photonic device, comprising:
a silicon substrate layer, an epitaxial buffer layer arranged on the silicon substrate layer, and a P-N junction arranged on the epitaxial buffer layer;
wherein the P-N junction comprises an n-GaN layer, an InGaN/GaN quantum well, and a p-GaN layer that are sequentially bottom-to-top connected, wherein a p-electrode is arranged on the p-GaN layer and a step-shaped stage is etched on an upper surface of the n-GaN layer, wherein the step-shaped stage comprises an upper stage and a lower stage arranged on a side of the upper stage, the upper stage being connected to a bottom face of the InGaN/GaN quantum well, wherein an n-electrode is arranged on the lower stage, wherein the n-GaN layer, the InGaN/GaN quantum well, the p-GaN layer, the p-electrode, and the n-electrode form a light-emitting diode (LED), wherein an optical waveguide is integrated with the LED, wherein the LED and the optical waveguide are both formed on a nitride layer of a silicon-based nitride wafer, and the optical waveguide is connected to the n-GaN layer, the InGaN/GaN quantum well and the p-GaN layer, wherein the LED and the optical waveguide both comprise a same layered structure, and wherein a cavity opposite to the p-electrode, the n-electrode, and the optical waveguide and passing through the silicon substrate layer and the epitaxial buffer layer is arranged under the n-GaN layer, such that the LED and the optical waveguide are suspended.

2. The integrated photonic device according to claim 1, wherein the p-electrode is formed by a p-electrode light-emitting region, a p-electrode conductive region and a p-electrode wiring region that are sequentially connected; the n-electrode is formed by an n-electrode conductive region and an n-electrode wiring region that are connected to each other; and the cavity is arranged under the p-electrode light-emitting region, the p-electrode conductive region, the n-electrode conductive region and the optical waveguide.

3. The integrated photonic device according to claim 1, wherein a plurality of optical waveguides are integrated with the LED.

4. The integrated photonic device according to claim 1, wherein the p-electrode and the n-electrode are both Ni/Au electrodes in which a deposited metal material is Ni/Au.

5. A method for fabricating an integrated photonic device according to claim 1, the method comprising:

step (1): thinning a silicon substrate of a nitride-on-silicon wafer by polishing it from a backside;

step (2): uniformly coating a photoresist layer on an upper surface of the silicon-based nitride wafer, and defining an optical waveguide region and an n-GaN step region in the photoresist layer by using an exposure technique;

step (3): etching the n-GaN step region and the optical waveguide region by using a technique of reactive ion beam etching;

step (4): removing a residual photoresist to obtain the step-shaped stage, the p-GaN layer, the InGaN/GaN quantum well and the optical waveguide;

step (5): uniformly coating a photoresist layer on an upper surface of the silicon-based nitride wafer, lithographically defining a p-electrode window region and an n-electrode window region, vapor depositing Ni/Au in the p-electrode window region and the n-electrode window region respectively to form an ohmic contact and produce the p-electrode and the n-electrode, wherein after the residual photoresist is removed, an LED is obtained;

step (6): fully covering topside device structures with a thick photoresist for device protection, spin coating a photoresist layer on a bottom side of the silicon substrate, and photolithographically defining a backside etching window aligned with, and totally covering, a conductive region and a light-emitting region in a p-electrode region, and a conductive region and the optical waveguide region in an n-electrode region by a double-sided alignment technique;

step (7): using the epitaxial buffer layer as an etching barrier layer, and etching the silicon substrate to a lower surface of the epitaxial buffer layer to form the cavity via a back etching window by using a deep silicon etching technique;

step (8): thinning a nitride material on the epitaxial buffer layer and the n-GaN layer from bottom to top by using a nitride etching technique; and step (9): removing a residual photoresist to obtain the integrated photonic device.

6. The method for fabricating an integrated photonic device according to claim 5, wherein at step (5), the vapor deposition of Ni/Au is performed by a lift-off process and a nitrogen annealing technique at a temperature of 500±5° C.

7. The method for fabricating an integrated photonic device according to claim 5, wherein at step (8), the nitride etching technique is an ion beam bombardment technique or a reactive ion beam etching technique.

* * * * *